(12) United States Patent
Arena

(10) Patent No.: US 8,471,243 B1
(45) Date of Patent: Jun. 25, 2013

(54) PHOTOACTIVE DEVICES WITH IMPROVED DISTRIBUTION OF CHARGE CARRIERS, AND METHODS OF FORMING SAME

(75) Inventor: Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/362,866

(22) Filed: Jan. 31, 2012

(51) Int. Cl.
*H01L 29/06* (2006.01)
(52) U.S. Cl.
USPC ............................................. 257/13; 438/20
(58) Field of Classification Search
USPC .............................................. 257/13; 438/20
See application file for complete search history.

(56) References Cited

U.S. PATENT DOCUMENTS

| | | | | |
|---|---|---|---|---|
| 5,172,384 | A * | 12/1992 | Goronkin et al. | 372/45.01 |
| 2007/0090339 | A1* | 4/2007 | Lee et al. | 257/14 |
| 2008/0093593 | A1 | 4/2008 | Ryu | |
| 2010/0032793 | A1 | 2/2010 | Guenard et al. | |
| 2010/0109126 | A1 | 5/2010 | Arena | |
| 2010/0176490 | A1 | 7/2010 | Letertre et al. | |

OTHER PUBLICATIONS

French Search Report and Opinion for French Application No. 1251158 dated Oct. 16, 2012, 6 pages.
Ni et al., Reduction of Efficiency Droop in InGaN Light Emitting Diodes by Coupled Quantum Wells, Applied Physics Letters, vol. 93, p. 171113 (2008).
Wang et al., Efficiency Droop Alleviation in InGaN/GaN Light-Emitting Diodes by Graded-Thickness Multiple Quantum Wells, Applied Physics Letters, vol. 97, p. 181101 (2010).

* cited by examiner

*Primary Examiner* — Jami M Valentine
(74) *Attorney, Agent, or Firm* — TraskBritt

(57) ABSTRACT

Radiation-emitting semiconductor devices include a first base region comprising an n-type III-V semiconductor material, a second base region comprising a p-type III-V semiconductor material, and a multi-quantum well structure disposed between the first base region and the second base region. The multi-quantum well structure includes at least three quantum well regions and at least two barrier regions. An electron hole energy barrier between a third of the quantum well regions and a second of the quantum well regions is less than an electron hole energy barrier between the second of the quantum well regions and a first of the quantum well regions. Methods of forming such devices include sequentially epitaxially depositing layers of such a multi-quantum well structure, and selecting a composition and configuration of the layers such that the electron hole energy barriers vary across the multi-quantum well structure.

49 Claims, 3 Drawing Sheets

PHOTOACTIVE DEVICES WITH IMPROVED DISTRIBUTION OF CHARGE CARRIERS, AND METHODS OF FORMING SAME

FIELD

Embodiments of the present invention generally relate to photoactive devices comprising III-V semiconductor materials, and to methods of forming such photoactive devices.

BACKGROUND

Photoactive devices are devices that are configured to convert electrical energy into electromagnetic radiation, or to convert electromagnetic radiation into electrical energy. Photoactive devices include, but are not limited to, light-emitting diodes (LEDs), semiconductor lasers, photodetectors, and solar cells. Such photoactive devices often include one or more planar layers of III-V semiconductor material. III-V semiconductor materials are materials that are predominantly comprised of one or more elements from group IIIA of the periodic table (B, Al, Ga, In, and Tl) and one or more elements from group VA of the periodic table (N, P, As, Sb, and Bi). The planar layers of III-V semiconductor material may be crystalline, and may comprise a single crystal of the III-V semiconductor material.

Layers of crystalline III-V semiconductor material generally include some quantity of defects within the crystal lattice of the III-V semiconductor material. These defects in the crystal structure may include, for example, point defects and line defects (e.g., threading dislocations). Such defects are detrimental to the performance of photoactive devices fabricated on or in the layer of III-V semiconductor material.

Additionally, currently known methods for fabricating layers of crystalline III-V semiconductor material generally involve epitaxial growth of the III-V semiconductor material on the surface of an underlying substrate, which has a crystal lattice similar to, but slightly different from the crystal lattice of the crystalline III-V semiconductor material. As a result, when the layer of crystalline III-V semiconductor material is grown over the different underlying substrate material, the crystal lattice of the crystalline III-V semiconductor material may be mechanically strained. As a result of this strain, as the thickness of the layer of III-V semiconductor material increases during growth, stress within the layer of III-V semiconductor material may increase until, at some critical thickness, defects, such as dislocations, become energetically favorable and form within the layer of III-V semiconductor material to alleviate the building stress therein.

In view of the above, it is difficult to fabricate relatively thick layers of crystalline III-V semiconductor material having relatively low concentrations of defects therein.

Photoactive devices may comprise an active region that includes a number of quantum well regions, each of which may comprise a layer of III-V semiconductor material. The quantum well regions may be separated from one another by barrier regions, which also may comprise a layer of III-V semiconductor material, but of different composition relative to the quantum well regions.

There is a discrepancy between the mobility of electrons and electron holes (vacant electron orbitals) in at least some III-V semiconductor materials. In other words, electrons may move through the III-V semiconductor materials relatively easier relative to electron holes. This discrepancy in the mobility between electrons and electron holes can lead to a non-uniform distribution of electrons and electron-holes within the active regions of photoactive devices. This phenomenon is discussed in further detail in X. Ni et al., *Reduction of Efficiency Droop in InGaN Light Emitting Diodes by Coupled Quantum Wells*, Applied Physics Letters, Vol. 93, pg. 171113 (2008), and in C. H. Wang et al., *Efficiency Droop Alleviation in InGaN/GaN Light-Emitting Diodes by Graded-Thickness Multiple Quantum Wells*, Applied Physics Letters, Vol. 97, pg. 181101 (2010), each of which is incorporated herein in its entirety by this reference.

BRIEF SUMMARY

In some embodiments, the present invention includes radiation-emitting semiconductor devices that comprise a first base region comprising an n-type III-V semiconductor material, a second base region comprising a p-type III-V semiconductor material, and a multi-quantum well structure disposed between the first base region and the second base region. The multi-quantum well structure includes at least three quantum well regions and at least two barrier regions. A first barrier region of the at least two barrier regions is disposed between a first quantum well region and a second quantum well region of the at least three quantum well regions. A second barrier region of the at least two barrier regions is disposed between the second quantum well region and the third quantum well region of the at least three quantum well regions. The first quantum well region is located closer to the first base region than the third quantum well region, and the third quantum well region is located closer to the second base region than the third quantum well region. Each of the first quantum well region, the second quantum well region, and the third quantum well region has a well region thickness in a direction extending between the first base region and the second base region of at least about two (2) nanometers, and each of the first barrier region and the second barrier region has a barrier region thickness in the direction extending between the first base region and the second base region greater than or equal to each of the well region thicknesses. Also, an electron hole energy barrier between the third quantum well region and the second quantum well region is less than an electron hole energy barrier between the second quantum well region and the first quantum well region.

In additional embodiments, the present invention comprises devices that include at least one light-emitting diode (LED). The LED includes a first base region comprising an n-type III-V semiconductor material, a second base region comprising a p-type III-V semiconductor material, and a multi-quantum well structure disposed between the first base region and the second base region. The multi-quantum well structure comprises at least three quantum well regions and at least two barrier regions. A first barrier region of the at least two barrier regions is disposed between a first quantum well region and a second quantum well region of the at least three quantum well regions, and a second barrier region of the at least two barrier regions is disposed between the second quantum well region and the third quantum well region of the at least three quantum well regions. The first quantum well region is located closer to the first base region than the third quantum well region, and the third quantum well region is located closer to the second base region than the third quantum well region. Each of the first quantum well region, the second quantum well region, and the third quantum well region comprises $In_xGa_{1-x}N$ and has a well region thickness in a direction extending between the first base region and the second base region of at least about two (2) nanometers. Each of the first barrier region and the second barrier region comprises $In_yGa_{1-y}N$, wherein y is at least about 0.05, and has a barrier region thickness in the direction extending between the first base region and the second base region greater than or equal to each of the well region thicknesses and at least about two nanometers (2). An electron hole energy barrier between the third quantum well region and the second quantum well region is less than an electron hole energy barrier between the second quantum well region and the first quantum well region.

In yet further embodiments, the present invention includes methods of forming radiation-emitting devices. In accordance with such methods, a plurality of III-V semiconductor material volumes may be sequentially epitaxially deposited over a substrate to form a multi-quantum well structure comprising a first barrier region disposed between a first quantum well region and a second quantum well region, and a second barrier region disposed between the second quantum well region and a third quantum well region. Each of the first quantum well region, the second quantum well region, and the third quantum well region may be formed to have a well region thickness of at least about two (2) nanometers. Each of the first barrier region and the second barrier region may be formed to have a barrier region thickness greater than or equal to each of the well region thicknesses. Additionally, a composition of each of the first quantum well region, the second quantum well region, and the third quantum well region may be selected such that an electron hole energy barrier between the third quantum well region and the second quantum well region is less than an electron hole energy barrier between the second quantum well region and the first quantum well region.

In further embodiments, the present invention includes methods of forming radiation-emitting devices. In accordance with such methods, a plurality of openings are formed that extend through a layer of strained semiconductor material over a strain relaxation layer. The strained semiconductor material and the strain relaxation layer are thermally treated to cause deformation of the strain relaxation layer and relaxation of the strained semiconductor material to form at least one volume of relaxed semiconductor material. A plurality of III-V semiconductor material volumes are sequentially epitaxially deposited over the at least one volume of relaxed semiconductor material to form a multi-quantum well structure comprising a first barrier region disposed between a first quantum well region and a second quantum well region, and a second barrier region disposed between the second quantum well region and a third quantum well region. Each of the first quantum well region, the second quantum well region, and the third quantum well region are formed to have a well region thickness of at least about two (2) nanometers. Each of the first barrier region and the second barrier region are formed to have a barrier region thickness greater than or equal to each of the well region thicknesses. Compositions of each of the first quantum well region, the second quantum well region, and the third quantum well region are selected such that an electron hole energy barrier between the third quantum well region and the second quantum well region is less than an electron hole energy barrier between the second quantum well region and the first quantum well region.

BRIEF DESCRIPTION OF THE SEVERAL VIEWS OF THE DRAWINGS

While the specification concludes with claims particularly pointing out and distinctly claiming what are regarded as embodiments of the invention, advantages of embodiments of the invention may be more readily ascertained from the detailed description below when read in conjunction with the accompanying drawings, in which:

FIG. 2 is a simplified cross-sectional view of a layer of strained semiconductor material over a strain relaxation layer on a base substrate;

FIG. 3 is a simplified cross-sectional like that of FIG. 2 illustrating a plurality of openings extending through the layer of strained semiconductor material;

FIG. 4 is a simplified cross-sectional view like those of FIGS. 2 and 3 illustrating volumes of relaxed semiconductor material formed by relaxing the strained semiconductor material with the assistance of the strain relaxation layer; and FIG. 5 is a simplified cross-sectional view of a radiation emitting semiconductor device disposed on a volume of relaxed semiconductor material like those shown in FIG. 4.

DETAILED DESCRIPTION

The illustrations presented herein are not meant to be actual views of any particular material, semiconductor structure or device, or method, but are merely idealized representations, which are employed to describe the present invention. Additionally, elements common between figures may retain the same numerical designation.

As used herein, the term "III-V semiconductor material" means and includes any material predominantly comprised of one or more elements from group IIIA of the periodic table (B, Al, Ga, In, and Tl) and one or more elements from group VA of the periodic table (N, P, As, Sb, and Bi).

As used herein, the term "critical thickness," when used with respect to a material, means the maximum thickness above which the formation of defects, such as dislocations, within the material becomes energetically favorable.

As used herein, the term "epitaxial layer of material," means a layer of material that is at least substantially a single crystal of the material and that has been formed such that the single crystal exhibits a known crystallographic orientation.

As used herein, the term "growth lattice parameter," when used with respect to an epitaxial layer of semiconductor material, means an average lattice parameter exhibited by the layer of semiconductor material as the layer of semiconductor material is epitaxially grown at an elevated temperature.

As used herein, the term "lattice strain," when used with respect to a layer of material, means strain of the crystal lattice in directions at least substantially parallel to the plane of the layer of material and may be compressive strain or tensile strain. Similarly, the term "average lattice parameter," when used with respect to a layer of material, means the average lattice parameters in dimensions at least substantially parallel to the plane of the layer of material.

Similarly, the term "strained" is used to indicate that the crystal lattice has been deformed (e.g., stretched or compressed) from the normal spacing for such material so that its lattice spacing is different than what would normally be encountered for such material in a homogeneous relaxed crystal.

Embodiments of the present disclosure include photoactive devices, such as radiation-emitting structures (e.g., LEDs), which include a multi-quantum well structure having an energy band structure that is tailored to provide an improved distribution of electron holes across the multi-quantum well structure during operation of the photoactive device.

Figure 1:
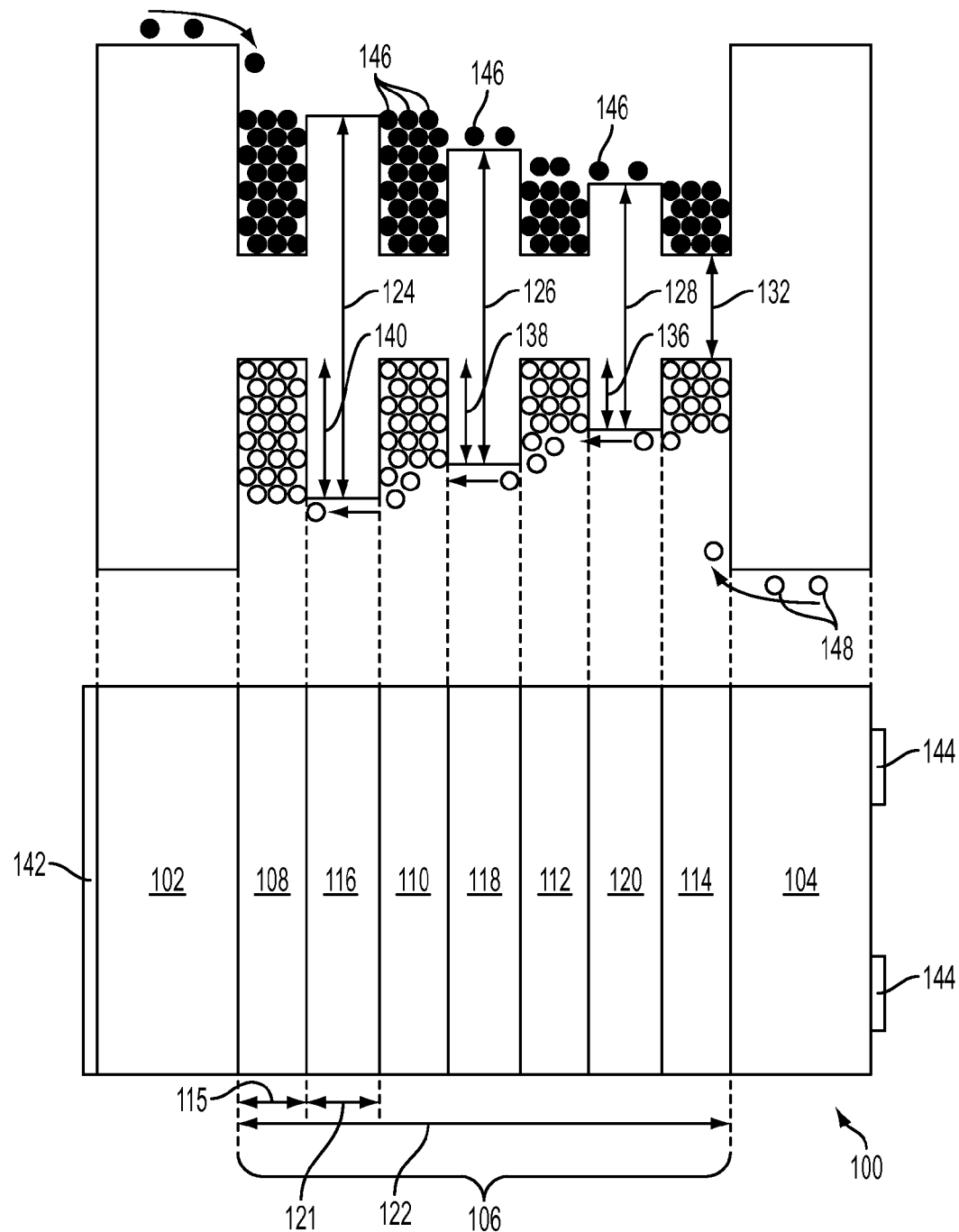
FIG. 1 is a simplified cross-sectional view of a radiation-emitting semiconductor device and a corresponding energy band diagram for the device.

FIG. 1 illustrates an example embodiment of a radiation-emitting semiconductor device 100 of the present disclosure. The semiconductor device 100 may comprise an LED, for example. A simplified energy band diagram exhibited by the semiconductor device 100 is shown over the semiconductor device 100 in FIG. 1. The different regions within the energy band structure are respectively aligned with the regions of the semiconductor device 100 to which they correspond.

As shown in FIG. 1, the radiation-emitting semiconductor device 100 includes a first base region 102, a second base region 104, and a multi-quantum well structure 106 disposed between the first base region 102 and the second base region 104.

The multi-quantum well structure 106 includes at least three quantum well regions. For example, in the embodiment of FIG. 1, the semiconductor device 100 includes a first quantum well region 108, a second quantum well region 110, a third quantum well region 112, and a fourth quantum well region 114. In additional embodiments, however, the radiation-emitting semiconductor device 100 may include only three quantum well regions or more than four quantum well regions.

Each of the quantum well regions 108-114 has a respective well region thickness 115 in a direction extending between the first base region 102 and the second base region 104. The respective well region thicknesses 115 of the quantum well regions 108-114 may be the same or different. By way of example and not limitation, each of the respective well region thicknesses 115 may be about two (2) nanometers or more, about five (5) nanometers or more, about ten (10) nanometers or more, or even about twenty (20) nanometers or more.

In the embodiment of FIG. 1, the first quantum well region 108 is located proximate the first base region 102, and the fourth quantum well region 114 is located proximate the second base region 104. Thus, the first quantum well region 108 is located closer to the first base region 102 than the second quantum well region 110, which is located closer to the first base region 102 than the third quantum well region 112, which is located closer to the first base region 102 than the fourth quantum well region 114. Similarly, the fourth quantum well region 114 is located closer to the second base region 104 than the third quantum well region 112, which is located closer to the second base region 104 than the second quantum well region 110, which is located closer to the second base region 104 than the first quantum well region 108.

A barrier region may be disposed between adjacent quantum well regions 108-114. For example, as shown in FIG. 1, a first barrier region 116 is disposed between the first quantum well region 108 and the second quantum well region 110, a second barrier region 118 is disposed between the second quantum well region 110 and the third quantum well region 112, and a third barrier region 120 is disposed between the third quantum well region 112 and the fourth quantum well region 114.

Each of the barrier regions 116-120 has a respective barrier region thickness 121 in a direction extending between the first base region 102 and the second base region 104. The respective barrier region thicknesses 121 of the barrier regions 116-120 may be the same or different. Each of the respective barrier region thicknesses 121 may be greater than or equal to the well region thicknesses 115 to prevent tunneling of electrons through the barrier regions 116-120 between the quantum well regions 108-114. By way of example and not limitation, each of the respective barrier region thicknesses 121 may be about two (2) nanometers or more, about five (5) nanometers or more, about ten (10) nanometers or more, about fifteen (15) nanometers or more, or even about twenty (20) nanometers or more.

The multi-quantum well structure 106 may have a total structure thickness 122 in the direction extending between the first base region 102 and the second base region 104 of, for example, about ten (10) nanometers or more, about twenty (20) nanometers or more, about fifty (50) nanometers or more, about eighty five (85) nanometers or more, or even about one hundred and forty (140) nanometers or more.

The first base region 102 may comprise an n-type semiconductor material, and the second base region 104 may comprise a p-type semiconductor material. By way of example and not limitation, each of the first base region 102 and the second base region 104 may comprise a III-V semiconductor material, such as $In_zGa_{1-z}N$, wherein z is between about 0.02 and about 0.17. The first base region 102 may be an intrinsic or doped n-type III-V semiconductor material, and the second base region 104 may be an intrinsic or doped p-type semiconductor material.

The first base region 102 may be electrically and structurally coupled to a first conductive contact 142, and the second base region 104 may be electrically and structurally coupled to a second conductive contact 144. Each of the first conductive contact 142 and the second conductive contact 144 may comprise, for example, one or more metals (e.g., aluminum, titanium, platinum, nickel gold, etc.) or metal alloys, and may comprise a number of layers of such metals or metal alloys. In additional embodiments, the first conductive contact 142 and/or the second conductive contact 144 may comprise a doped or intrinsic n-type or p-type semiconductor material, respectively.

Metals and metal alloys may not be transparent to a wavelength or wavelengths of electromagnetic radiation generated within the multi-quantum well structure 106 during operation of the semiconductor device 100. Thus, as shown in FIG. 1, the second conductive contact 144 may not cover the entire surface of the second base region 104. For example, the second conductive contact 144 may be patterned such that one or more apertures extend through the second conductive contact 144. In this configuration, radiation generated within the multi-quantum well structure 106 is to be transmitted out from the semiconductor device 100 through the second base region 104 and past the second conductive contact 144. In addition or as an alternative, the first conductive contact 142 could be patterned as described with reference to the second conductive contact 144.

Referring to the energy band diagram in FIG. 1, the first conductive contact 142 and the first base region 102 may supply the multi-quantum well structure 106 with electrons 146. The second conductive contact 144 and the second base region 104 may supply the multi-quantum well structure 106 with electron holes 148. As previously mentioned, the electrons 146 may exhibit a higher mobility within the multi-quantum well structure 106 relative to the electron holes 148. Thus, in previously known devices, when a voltage is applied across the multi-quantum well structure 106 between the first base region 102 and the second base region 104, although the electrons 146 may be relatively evenly distributed across the multi-quantum well structure 106, the electron holes 148 may be more unevenly distributed across the multi-quantum well structure 106 and may be more highly concentrated in the quantum well regions nearest to the second base region 104. Such an uneven distribution of electron holes 148 across the multi-quantum well structure 106 increases the probability of undesirable, non-radiant Auger recombination of electron 146 and electron hole 148 pairs.

As previously mentioned, the multi-quantum well structure 106 of embodiments of the present disclosure has an energy band structure that is tailored to provide an improved distribution of electron holes 148 across the multi-quantum well structure 106 during operation of the semiconductor device 100.

With continued reference to the energy band diagram of FIG. 1, the quantum well regions 108-114 may have a material composition and structural configuration selected to provide each of the quantum well regions 108-114 with a bandgap energy 132. In the embodiment shown in FIG. 1, the bandgap energy 132 is at least substantially equal in the different quantum well regions 108-114. In additional embodiments, a bandgap energy 132 of one or more of the quantum well regions 108-114 may differ from a bandgap energy of another of the quantum well regions 108-114.

The barrier regions 116-120 may have a material composition and structural configuration selected to provide each of the barrier regions 116-120 with respective bandgap energies 124-128. The bandgap energy 124 in the first barrier region 116 may be greater than the bandgap energy 126 in the second barrier region 118, and the bandgap energy 126 in the second barrier region 118 may be greater than the bandgap energy 128 in the third barrier region 120, as shown in the energy band diagram of FIG. 1. Further, each of the bandgap energies 132 of the quantum well regions 108-114 may be less than each of the bandgap energies 124-128 of the barrier regions 116-120.

In this configuration, an electron hole energy barrier 136 between the fourth quantum well 114 and the third quantum well 112 may be less than an electron hole energy barrier 138 between the third quantum well 112 and the second quantum well 110, and an electron hole energy barrier 138 between the third quantum well 112 and the second quantum well 110 may be less than an electron hole energy barrier 140 between the second quantum well 110 and the first quantum well 108. In other words, the electron hole energy barriers 136-140 across the barrier regions 116-120 may increase in a step-wise manner across the multi-quantum well structure 106 in the direction extending from the second base region 104 (which supplies electron holes 148 to the multi-quantum well structure 106) to the first base region 102. The electron hole energy barriers 136-140 are the differences in the energies of the valence band across the interfaces between the quantum well regions 108-114 and the adjacent barrier regions 116-120. As a result of the increasing electron hole energy barriers 136-140 across the barrier regions 116-120 moving from the second base region 104 toward the first base region 102, a more even distribution of electron holes 148 may be achieved within the multi-quantum well structure 106, which may result in improved efficiency during operation of the radiation-emitting semiconductor device 100.

As previously mentioned, the barrier regions 116-120 may have a material composition and structural configuration selected to provide each of the barrier regions 116-120 with their different, respective bandgap energies 124-128. By way of example and not limitation, each of the barrier regions 116-120 may comprise a ternary III-nitride material, such as $In_yGa_{1-y}N$, wherein y is at least about 0.05. Increasing the indium content (i.e., increasing the value of y) in the $In_yGa_{1-y}N$ of the barrier regions 116-120 may decrease the bandgap energy of the barrier regions 116-120. Thus, the second barrier region 118 may have a higher indium content relative to the first barrier region 116, and the third barrier region 120 may have a higher indium content relative to the second barrier region 118. By way of example and not limitation, the first barrier region 116 may comprise $In_yGa_{1-y}N$, wherein y is between about 0.05 and about 0.15, the second barrier region 118 may comprise $In_yGa_{1-y}N$, wherein y is between about 0.10 and about 0.20, and the third barrier region 120 may comprise $In_yGa_{1-y}N$, wherein y is between about 0.15 and about 0.25.

The quantum well regions 108-114 also may comprise a ternary III-nitride material, such as $In_xGa_{1-x}N$, wherein x may be at least about 0.12, or even about 0.17 or more.

The quantum well regions 108-114 and the barrier regions 116-120 described above may comprise a generally planar layer of III-V semiconductor material (e.g., ternary III-nitride material, such as indium gallium nitride (InGaN)). The layers of III-V semiconductor material may be crystalline, and may comprise a single crystal of the III-V semiconductor material.

As known in the art, layers of crystalline III-V semiconductor material generally include some quantity of defects within the crystal lattice of the III-V semiconductor material. These defects in the crystal structure may include, for example, point defects and line defects (e.g., threading dislocations). Such defects are detrimental to the performance of photoactive devices comprising the layers of III-V semiconductor material.

The layers of crystalline III-V semiconductor material may be fabricated by epitaxially growing the layers of III-V semiconductor material on the surface of an underlying substrate, which has a crystal lattice similar to, but slightly different from the crystal lattice of the crystalline III-V semiconductor material. As a result, when the layer of crystalline III-V semiconductor material is grown over the different underlying substrate material, the crystal lattice of the crystalline III-V semiconductor material may be mechanically strained. As a result of this strain, as the thickness of the layer of III-V semiconductor material increases during growth, stress within the layer of III-V semiconductor material may increase until, at some critical thickness, defects, such as dislocations, become energetically favorable and form within the layer of III-V semiconductor material to alleviate the building stress therein.

When epitaxially depositing layers of indium gallium nitride (InGaN), the critical thickness of the layers of indium gallium nitride decreases with increasing indium content. Thus, it may be difficult or impossible to fabricate layers of indium gallium nitride of relatively high indium concentration that have relatively high layer thicknesses and relatively low concentrations of defects therein.

To overcome these difficulties, recently developed methods may be used to fabricate a multi-quantum well structure 106 including quantum well regions 108-114 and barrier regions 116-120 of a ternary III-nitride material, such as indium gallium nitride, as described hereinabove. By way of example and not limitation, methods as described in any of U.S. Patent Application Publication No. 2010/0032793, which published Feb. 11, 2010 to Guenard et al., U.S. Patent Application Publication No. 2010/0176490, which published Jul. 15, 2010 to Letertre et al., or U.S. Patent Application Publication No. 2010/0109126, which published May 6, 2010 to Arena et al., which are incorporated herein in their entireties by this reference, may be used to fabricate a multi-quantum well structure 106 of a radiation-emitting semiconductor device 100 as described herein.

Non-limiting examples of methods that may be used to fabricate a multi-quantum well structure 106 of a radiation-emitting semiconductor device 100 as described herein are described below with reference to FIGS. 2 through 5.

Figure 2:
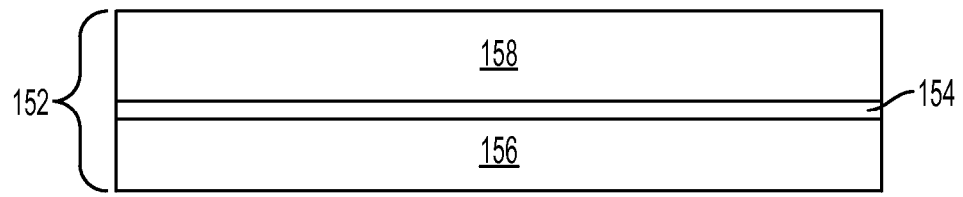
FIG. 2 through FIG. 5 are used to illustrate a method for forming a radiation-emitting semiconductor device in accordance with embodiments of the disclosure.

Referring to FIG. 2, a substrate 152 may be provided that includes a layer of strained semiconductor material 158 over a base substrate 156 with a strain relaxation layer 154 disposed therebetween. The base substrate 156 may comprise, for example, any one or more of sapphire, silicon carbide, silicon, and a metallic material (e.g., molybdenum, tantalum, etc.). The strain relaxation layer 154 may comprise a material such as, for example, silicate glass, phosphosilicate glass, borosilicate glass, or borophosphosilicate glass. The strained semiconductor material 158 ultimately may be used as a seed layer for epitaxially depositing a plurality of layers thereon to form a multi-quantum well structure 106 hereinabove. By way of example and not limitation, the layer of strained semiconductor material 158 may comprise $In_zGa_{1-z}N$, wherein z is between about 0.06 and about 0.08.

The layer of strained semiconductor material 158 may comprise a III-V semiconductor material. By way of non-limiting example, the layer of strained semiconductor material 158 may comprise at least one of gallium nitride (GaN), indium gallium nitride ($In_xGa_{1-x}N$), and aluminum gallium nitride ($Al_xGa_{1-x}N$).

Figure 3:
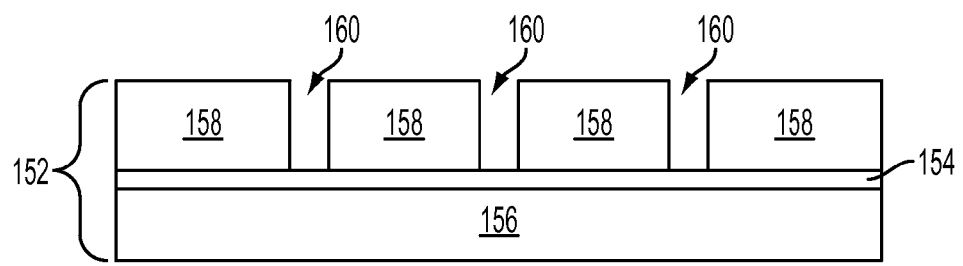
Figure 4:
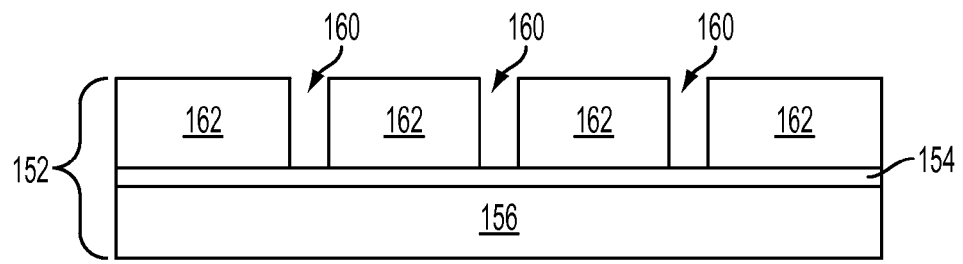

Referring to FIG. 3, a plurality of openings 160 may be formed that extend through the layer of strained semiconductor material 158. By way of example and not limitation, a masking and etching process may be used to form the openings 160 through the layer of strained semiconductor material 158. After forming the openings 160 through the layer of strained semiconductor material 158, the structure may be subjected to a thermal treatment process at a temperature at which the strain relaxation layer 154 may deform plastically or elastically in such a manner as to allow an accompanying relaxation of the stress and/or strain in the remaining portion of the layer of strained semiconductor material 158, so as to transform the remaining portion of the layer of strained semiconductor material 158 into at least one volume of relaxed semiconductor material 162, as illustrated in FIG. 4.

Figure 5:
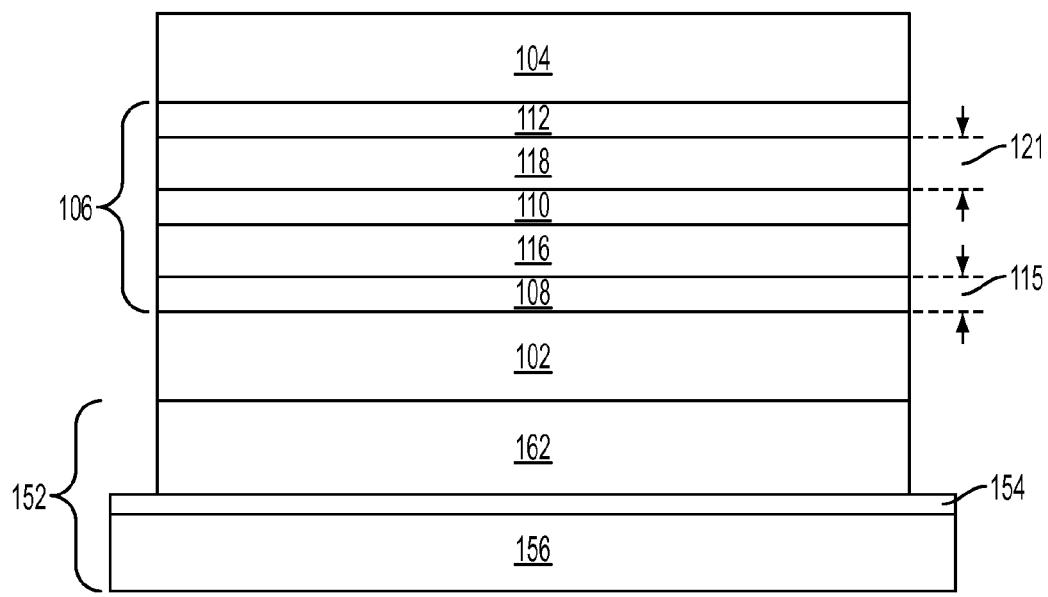

Referring to FIG. 5, various layers of the radiation-emitting semiconductor device 100 (FIG. 1) may be formed by sequentially epitaxially depositing a plurality of III-V semiconductor material volumes over a volume of relaxed semiconductor material 162. For example, a first base region 102 of n-type ternary III-nitride material having a composition and configuration as previously described may be epitaxially deposited on the volume of relaxed semiconductor material 162. Quantum well regions 108-114 and barrier regions 116-120 comprising ternary III-nitride materials having compositions and configurations as described hereinabove then may be epitaxially deposited on the first base region 102 to form a multi-quantum well structure 106. A second base region 104 of p-type semiconductor material having a composition and configuration as previously described then may be epitaxially deposited on the multi-quantum well structure 106.

In some embodiments, the substrate 152 may be removed to provide access to the first base region 102, for example, to form one or more electrical contacts or contact layers thereon. One or more of an etching process, a grinding process, a chemical-mechanical polishing (CMP) process, a laser ablation process, and a SMART CUT® process may be used to remove the substrate 152. The first conductive contact 142 then may be formed or otherwise provided on the first base region 102, and the second conductive contact 144 may be formed or otherwise provided on the second base region 104.

Additional non-limiting example embodiments of the disclosure are provided below:

Embodiment 1: A radiation-emitting semiconductor device, comprising: a first base region comprising an n-type III-V semiconductor material; a second base region comprising a p-type III-V semiconductor material; and a multi-quantum well structure disposed between the first base region and the second base region, the multi-quantum well structure comprising at least three quantum well regions and at least two barrier regions, a first barrier region of the at least two barrier regions disposed between a first quantum well region and a second quantum well region of the at least three quantum well regions, a second barrier region of the at least two barrier regions disposed between the second quantum well region and a third quantum well region of the at least three quantum well regions, the first quantum well region located closer to the first base region than the third quantum well region, and the third quantum well region located closer to the second base region than the first quantum well region; wherein each of the first quantum well region, the second quantum well region, and the third quantum well region has a well region thickness in a direction extending between the first base region and the second base region of at least about two (2) nanometers, and each of the first barrier region and the second barrier region has a barrier region thickness in the direction extending between the first base region and the second base region greater than or equal to each of the well region thicknesses; and wherein an electron hole energy barrier between the third quantum well region and the second quantum well region is less than an electron hole energy barrier between the second quantum well region and the first quantum well region.

Embodiment 2: The radiation-emitting semiconductor device of Embodiment 1, wherein each of the first quantum well region, the second quantum well region, and the third quantum well region comprises a ternary III-nitride material.

Embodiment 3: The radiation-emitting semiconductor device of Embodiment 2, wherein the ternary III-nitride material comprises $In_{Ga1-x}N$.

Embodiment 4: The radiation-emitting semiconductor device of Embodiment 3, wherein x is at least about 0.12.

Embodiment 5: The radiation-emitting semiconductor device of any one of Embodiments 1 through 4, wherein each of the first barrier region and the second barrier region comprises a ternary III-nitride material.

Embodiment 6: The radiation-emitting semiconductor device of Embodiment 5, wherein the ternary III-nitride material of the first barrier region and the second barrier region comprises $In_yGa_{1-y}N$.

Embodiment 7: The radiation-emitting semiconductor device of Embodiment 6, wherein y is at least about 0.05.

Embodiment 8: The radiation-emitting semiconductor device of any one of Embodiments 1 through 4, wherein each of the first barrier region and the second barrier region comprises a binary III-nitride material.

Embodiment 9: The radiation-emitting semiconductor device of Embodiment 8, wherein the binary III-nitride material of the first barrier region and the second barrier region comprises GaN.

Embodiment 10: The radiation-emitting semiconductor device of any one of Embodiments 1 through 9, wherein the well region thickness of each of the first quantum well region, the second quantum well region, and the third quantum well region is at least about five (5) nanometers.

Embodiment 11: The radiation-emitting semiconductor device of Embodiment 10, wherein the well region thickness of each of the first quantum well region, the second quantum well region, and the third quantum well region is at least about ten (10) nanometers.

Embodiment 12: The radiation-emitting semiconductor device of Embodiment 11, wherein the well region thickness of each of the first quantum well region, the second quantum well region, and the third quantum well region is at least about twenty (20) nanometers.

Embodiment 13: The radiation-emitting semiconductor device of any one of Embodiments 1 through 12, wherein the first bather region has a first bandgap energy and the second barrier region has a second bandgap energy, the second bandgap energy being less than the first bandgap energy.

Embodiment 14: The radiation-emitting semiconductor device of any one of Embodiments 1 through 13, wherein the multi-quantum well structure further comprises one or more additional quantum well regions and one or more additional bather regions, and wherein the electron hole energy barriers between adjacent quantum well regions in the multi-quantum well structure decrease in a step-wise manner across the multi-quantum well structure from the first base region to the second base region.

Embodiment 15: A device including at least one light-emitting diode (LED), comprising: a first base region comprising an n-type III-V semiconductor material; a second base region comprising a p-type III-V semiconductor material; and a multi-quantum well structure disposed between the first base region and the second base region, the multi-quantum well structure comprising at least three quantum well regions and at least two barrier regions, a first barrier region of the at least two barrier regions disposed between a first quantum well region and a second quantum well region of the at least three quantum well regions, a second barrier region of the at least two barrier regions disposed between the second quantum well region and the third quantum well region of the at least three quantum well regions, the first quantum well region located closer to the first base region than the third quantum well region, and the third quantum well region located closer to the second base region than the third quantum well region; wherein each of the first quantum well region, the second quantum well region, and the third quantum well region comprises $In_xGa_{1-x}N$ and has a well region thickness in a direction extending between the first base region and the second base region of at least about two (2) nanometers, and each of the first barrier region and the second barrier region comprises $In_yGa_{1-y}N$, wherein y is at least about 0.05, and has a barrier region thickness in the direction extending between the first base region and the second base region greater than each of the well region thicknesses and at least about two (2) nanometers; and wherein an electron hole energy barrier between the third quantum well region and the second quantum well region is less than an electron hole energy barrier between the second quantum well region and the first quantum well region.

Embodiment 16: The device of Embodiment 15, wherein the well region thickness of each of the first quantum well region, the second quantum well region, and the third quantum well region is at least about five (5) nanometers.

Embodiment 17: The device of Embodiment 15 or Embodiment 16, wherein the first barrier region has a first bandgap energy and the second barrier region has a second bandgap energy, the second bandgap energy being less than the first bandgap energy.

Embodiment 18: The device of Embodiment 15 or Embodiment 17, wherein the multi-quantum well structure has a total structure thickness in the direction extending between the first base region and the second base region of at least about 10 nm.

Embodiment 19: A method of forming a radiation-emitting device, comprising: sequentially epitaxially depositing a plurality of III-V semiconductor material volumes over a substrate to form a multi-quantum well structure comprising a first barrier region disposed between a first quantum well region and a second quantum well region, and a second barrier region disposed between the second quantum well region and a third quantum well region; forming each of the first quantum well region, the second quantum well region, and the third quantum well region to have a well region thickness of at least about two (2) nanometers; forming each of the first barrier region and the second barrier region to have a barrier region thickness greater than or equal to each of the well region thicknesses; and selecting a composition of each of the first quantum well region, the second quantum well region, and the third quantum well region such that an electron hole energy barrier between the third quantum well region and the second quantum well region is less than an electron hole energy barrier between the second quantum well region and the first quantum well region.

Embodiment 20: The method of Embodiment 19, further comprising forming each of the first quantum well region, the second quantum well region, and the third quantum well region to comprise a ternary III-nitride material.

Embodiment 21: The method of Embodiment 20, further comprising selecting the ternary III-nitride material to comprise $In_xGa_{1-x}N$.

Embodiment 22: The method of Embodiment 21, further comprising formulating the $In_xGa_{1-x}N$ such that x is at least about 0.12.

Embodiment 23: The method of any one of Embodiments 19 through 22, further comprising forming each of the first barrier region and the second barrier region to comprise a ternary III-nitride material.

Embodiment 24: The method of Embodiment 23, further comprising selecting the ternary III-nitride material of the first barrier region and the second barrier region to comprise $In_yGa_{1-y}N$.

Embodiment 25: The method of Embodiment 24, further comprising formulating the $In_yGa_{1-y}N$ such that y is at least about 0.05.

Embodiment 26: The method of any one of Embodiments 19 through 22, further comprising forming each of the first barrier region and the second barrier region to comprise a binary III-nitride material.

Embodiment 27: The method of Embodiment 26, further comprising selecting the binary III-nitride material of the first barrier region and the second barrier region to comprise GaN.

Embodiment 28: The method of any one of Embodiments 19 through 27, further comprising forming each of the first quantum well region, the second quantum well region, and the third quantum well region to have a respective well region thickness of at least about five (5) nanometers.

Embodiment 29: The method of Embodiment 28, further comprising forming each of the first quantum well region, the second quantum well region, and the third quantum well region to have a respective well region thickness of at least about ten (10) nanometers.

Embodiment 30: The method of Embodiment 29, further comprising forming each of the first quantum well region, the second quantum well region, and the third quantum well region to have a respective well region thickness of at least about twenty (20) nanometers.

Embodiment 31: The method of any one of Embodiments 19 through 30, further comprising forming the first barrier region to have a first bandgap energy, and forming the second barrier region to have a second bandgap energy less than the first bandgap energy.

Embodiment 32: The method of any one of Embodiments 19 through 27, further comprising forming the multi-quantum well structure to have a total structure thickness of at least about 10 nm.

Embodiment 33: A method of forming a radiation-emitting device, comprising: forming a plurality of openings extending through a layer of strained semiconductor material over a strain relaxation layer; thermally treating the strained semiconductor material and the strain relaxation layer and causing deformation of the strain relaxation layer and relaxation of the strained semiconductor material to form at least one volume of relaxed semiconductor material; sequentially epitaxially depositing a plurality of III-V semiconductor material volumes over the at least one volume of relaxed semiconductor material to form a multi-quantum well structure comprising a first barrier region disposed between a first quantum well region and a second quantum well region, and a second barrier region disposed between the second quantum well region and a third quantum well region; forming each of the first quantum well region, the second quantum well region, and the third quantum well region to have a well region thickness of at least about two (2) nanometers; forming each of the first barrier region and the second barrier region to have a barrier region thickness greater than or equal to each of the well region thicknesses; and selecting a composition of each of the first quantum well region, the second quantum well region, and the third quantum well region such that an electron hole energy barrier between the third quantum well region and the second quantum well region is less than an electron hole energy barrier between the second quantum well region and the first quantum well region.

Embodiment 34: The method of Embodiment 33, further comprising forming each of the first quantum well region, the second quantum well region, and the third quantum well region to comprise a ternary III-nitride material.

Embodiment 35: The method of Embodiment 34, further comprising selecting the ternary III-nitride material to comprise $In_xGa_{1-x}N$.

Embodiment 36: The method of Embodiment 35, further comprising formulating the $In_xGa_{1-x}N$ such that x is at least about 0.12.

Embodiment 37: The method of any one of Embodiments 33 through 36, further comprising forming each of the first barrier region and the second barrier region to comprise a ternary III-nitride material.

Embodiment 38: The method of Embodiment 37, further comprising selecting the ternary III-nitride material of the first barrier region and the second barrier region to comprise $In_yGa_{1-y}N$.

Embodiment 39: The method of Embodiment 38, further comprising formulating the $In_yGa_{1-y}N$ such that y is at least about 0.05.

Embodiment 40: The method of any one of Embodiments 33 through 36, further comprising forming each of the first barrier region and the second barrier region to comprise a binary III-nitride material.

Embodiment 41: The method of Embodiment 40, further comprising selecting the binary III-nitride material of the first barrier region and the second barrier region to comprise GaN.

Embodiment 42: The method of any one of Embodiments 33 through 41, further comprising forming each of the first quantum well region, the second quantum well region, and the third quantum well region to have a respective well region thickness of at least about five (5) nanometers.

Embodiment 43: The method of Embodiment 42, further comprising forming each of the first quantum well region, the second quantum well region, and the third quantum well region to have a respective well region thickness of at least about ten (10) nanometers.

Embodiment 44: The method of Embodiment 43, further comprising forming each of the first quantum well region, the second quantum well region, and the third quantum well region to have a respective well region thickness of at least about twenty (20) nanometers.

Embodiment 45: The method of any one of Embodiments 33 through 44, further comprising forming the first barrier region to have a first bandgap energy, and forming the second barrier region to have a second bandgap energy less than the first bandgap energy.

Embodiment 46: The method of any one of Embodiments 33 through 41, further comprising forming the multi-quantum well structure to have a total structure thickness of at least about 10 nm.

Embodiment 47: The method of any one of Embodiments 33 through 46, further comprising forming the strained semiconductor material to comprise $In_zGa_{1-z}N$.

Embodiment 48: The method of Embodiment 47, further comprising formulating the $In_zGa_{1-z}N$ such that z is between about 0.06 and about 0.08.

Embodiment 49: The method of any one of Embodiments 33 through 48, further comprising forming the strain relaxation layer to comprise at least one of a silicate glass, a phosphosilicate glass, a borosilicate glass, and a borophosphosilicate glass.

While the present invention has been described herein with respect to certain example embodiments, those of ordinary skill in the art will recognize and appreciate that it is not so limited. Rather, many additions, deletions and modifications to the example embodiments may be made without departing from the scope of the invention as hereinafter claimed. For example, features from one example embodiment may be combined with features of another embodiment while still being encompassed within the scope of the invention as contemplated by the inventors.

What is claimed is:

1. A radiation-emitting semiconductor device, comprising:
a first base region comprising an n-type III-V semiconductor material;
a second base region comprising a p-type III-V semiconductor material; and
a multi-quantum well structure disposed between the first base region and the second base region, the multi-quantum well structure comprising at least three quantum well regions and at least two barrier regions, a first barrier region of the at least two barrier regions disposed between a first quantum well region and a second quantum well region of the at least three quantum well regions, a second barrier region of the at least two barrier regions disposed between the second quantum well region and a third quantum well region of the at least three quantum well regions, the first quantum well region located closer to the first base region than the third quantum well region, and the third quantum well region located closer to the second base region than the first quantum well region;
wherein each of the first quantum well region, the second quantum well region, and the third quantum well region has a well region thickness in a direction extending between the first base region and the second base region of at least about two (2) nanometers, and each of the first barrier region and the second barrier region has a barrier region thickness in the direction extending between the first base region and the second base region greater than or equal to each of the well region thicknesses; and wherein an electron hole energy barrier between the third quantum well region and the second quantum well region is less than an electron hole energy barrier between the second quantum well region and the first quantum well region.

2. The radiation-emitting semiconductor device of claim 1, wherein each of the first quantum well region, the second quantum well region, and the third quantum well region comprises a ternary III-nitride material.

3. The radiation-emitting semiconductor device of claim 2, wherein the ternary III-nitride material comprises $In_xGa_{1-x}N$.

4. The radiation-emitting semiconductor device of claim 3, wherein x is at least about 0.12.

5. The radiation-emitting semiconductor device of claim 2, wherein each of the first barrier region and the second barrier region comprises a ternary III-nitride material.

6. The radiation-emitting semiconductor device of claim 5, wherein the ternary III-nitride material of the first barrier region and the second barrier region comprises $In_yGa_{1-y}N$.

7. The radiation-emitting semiconductor device of claim 6, wherein y is at least about 0.05.

8. The radiation-emitting semiconductor device of claim 2, wherein each of the first barrier region and the second barrier region comprises a binary III-nitride material.

9. The radiation-emitting semiconductor device of claim 8, wherein the binary III-nitride material of the first barrier region and the second barrier region comprises GaN.

10. The radiation-emitting semiconductor device of claim 1, wherein the well region thickness of each of the first quantum well region, the second quantum well region, and the third quantum well region is at least about five (5) nanometers.

11. The radiation-emitting semiconductor device of claim 10, wherein the well region thickness of each of the first quantum well region, the second quantum well region, and the third quantum well region is at least about ten (10) nanometers.

12. The radiation-emitting semiconductor device of claim 11, wherein the well region thickness of each of the first quantum well region, the second quantum well region, and the third quantum well region is at least about twenty (20) nanometers.

13. The radiation-emitting semiconductor device of claim 1, wherein the first barrier region has a first bandgap energy and the second barrier region has a second bandgap energy, the second bandgap energy being less than the first bandgap energy.

14. The radiation-emitting semiconductor device of claim 1, wherein the multi-quantum well structure further comprises one or more additional quantum well regions and one or more additional barrier regions, and wherein the electron hole energy barriers between adjacent quantum well regions in the multi-quantum well structure decrease in a step-wise manner across the multi-quantum well structure from the first base region to the second base region.

15. A device including at least one light-emitting diode (LED), comprising:
a first base region comprising an n-type III-V semiconductor material;
a second base region comprising a p-type III-V semiconductor material; and
a multi-quantum well structure disposed between the first base region and the second base region, the multi-quantum well structure comprising at least three quantum well regions and at least two barrier regions, a first barrier region of the at least two barrier regions disposed between a first quantum well region and a second quantum well region of the at least three quantum well regions, a second barrier region of the at least two barrier regions disposed between the second quantum well region and a third quantum well region of the at least three quantum well regions, the first quantum well region located closer to the first base region than the third quantum well region, and the third quantum well region located closer to the second base region than the first quantum well region;

wherein each of the first quantum well region, the second quantum well region, and the third quantum well region comprises $In_xGa_{1-x}N$ and has a well region thickness in a direction extending between the first base region and the second base region of at least about two (2) nanometers, and each of the first barrier region and the second barrier region comprises $In_yGa_{1-y}N$, wherein y is at least about 0.05, and has a barrier region thickness in the direction extending between the first base region and the second base region greater than each of the well region thicknesses and at least about two (2) nanometers; and wherein an electron hole energy barrier between the third quantum well region and the second quantum well region is less than an electron hole energy barrier between the second quantum well region and the first quantum well region.

16. The device of claim 15, wherein the well region thickness of each of the first quantum well region, the second quantum well region, and the third quantum well region is at least about five (5) nanometers.

17. The device of claim 15, wherein the first barrier region has a first bandgap energy and the second barrier region has a second bandgap energy, the second bandgap energy being less than the first bandgap energy.

18. The device of claim 15, wherein the multi-quantum well structure has a total structure thickness in the direction extending between the first base region and the second base region of at least about 10 nm.

19. A method of forming a radiation-emitting device, comprising:
sequentially epitaxially depositing a plurality of III-V semiconductor material volumes over a substrate to form a multi-quantum well structure comprising a first barrier region disposed between a first quantum well region and a second quantum well region, and a second barrier region disposed between the second quantum well region and a third quantum well region;
forming each of the first quantum well region, the second quantum well region, and the third quantum well region to have a well region thickness of at least about two (2) nanometers;
forming each of the first barrier region and the second barrier region to have a barrier region thickness greater than or equal to each of the well region thicknesses; and
selecting a composition of each of the first quantum well region, the second quantum well region, and the third quantum well region such that an electron hole energy barrier between the third quantum well region and the second quantum well region is less than an electron hole energy barrier between the second quantum well region and the first quantum well region.

20. The method of claim 19, further comprising forming each of the first quantum well region, the second quantum well region, and the third quantum well region to comprise a ternary III-nitride material.

21. The method of claim 20, further comprising selecting the ternary III-nitride material to comprise $In_xGa_{1-x}N$.

22. The method of claim 21, further comprising formulating the $In_xGa_{1-x}N$ such that x is at least about 0.12.

23. The method of claim 20, further comprising forming each of the first barrier region and the second barrier region to comprise a ternary III-nitride material.

24. The method of claim 23, further comprising selecting the ternary III-nitride material of the first barrier region and the second barrier region to comprise $In_yGa_{1-y}N$.

25. The method of claim 24, further comprising formulating the $In_yGa_{1-y}N$ such that y is at least about 0.05.

26. The method of claim 20, further comprising forming each of the first barrier region and the second barrier region to comprise a binary III-nitride material.

27. The method of claim 26, further comprising selecting the binary III-nitride material of the first barrier region and the second barrier region to comprise GaN.

28. The method of claim 19, further comprising forming each of the first quantum well region, the second quantum well region, and the third quantum well region to have a respective well region thickness of at least about five (5) nanometers.

29. The method of claim 28, further comprising forming each of the first quantum well region, the second quantum well region, and the third quantum well region to have a respective well region thickness of at least about ten (10) nanometers.

30. The method of claim 29, further comprising forming each of the first quantum well region, the second quantum well region, and the third quantum well region to have a respective well region thickness of at least about twenty (20) nanometers.

31. The method of claim 19, further comprising forming the first barrier region to have a first bandgap energy, and forming the second barrier region to have a second bandgap energy less than the first bandgap energy.

32. The method of claim 19, further comprising forming the multi-quantum well structure to have a total structure thickness of at least about 10 nm.

33. A method of forming a radiation-emitting device, comprising:
    forming a plurality of openings extending through a layer of strained semiconductor material over a strain relaxation layer;
    thermally treating the strained semiconductor material and the strain relaxation layer and causing deformation of the strain relaxation layer and relaxation of the strained semiconductor material to form at least one volume of relaxed semiconductor material;
    sequentially epitaxially depositing a plurality of III-V semiconductor material volumes over the at least one volume of relaxed semiconductor material to form a multi-quantum well structure comprising a first barrier region disposed between a first quantum well region and a second quantum well region, and a second barrier region disposed between the second quantum well region and a third quantum well region;
    forming each of the first quantum well region, the second quantum well region, and the third quantum well region to have a well region thickness of at least about two (2) nanometers;
    forming each of the first barrier region and the second barrier region to have a barrier region thickness greater than or equal to each of the well region thicknesses; and
    selecting a composition of each of the first quantum well region, the second quantum well region, and the third quantum well region such that an electron hole energy barrier between the third quantum well region and the second quantum well region is less than an electron hole energy barrier between the second quantum well region and the first quantum well region.

34. The method of claim 33, further comprising forming each of the first quantum well region, the second quantum well region, and the third quantum well region to comprise a ternary III-nitride material.

35. The method of claim 34, further comprising selecting the ternary III-nitride material to comprise $In_xGa_{1-x}N$.

36. The method of claim 35, further comprising formulating the $In_xGa_{1-x}N$ such that x is at least about 0.12.

37. The method of claim 34, further comprising forming each of the first barrier region and the second barrier region to comprise a ternary III-nitride material.

38. The method of claim 37, further comprising selecting the ternary III-nitride material of the first barrier region and the second barrier region to comprise $In_yGa_{1-y}N$.

39. The method of claim 38, further comprising formulating the $In_yGa_{1-y}N$ such that y is at least about 0.05.

40. The method of claim 34, further comprising forming each of the first barrier region and the second barrier region to comprise a binary III-nitride material.

41. The method of claim 40, further comprising selecting the binary III-nitride material of the first barrier region and the second barrier region to comprise GaN.

42. The method of claim 33, further comprising forming each of the first quantum well region, the second quantum well region, and the third quantum well region to have a respective well region thickness of at least about five (5) nanometers.

43. The method of claim 42, further comprising forming each of the first quantum well region, the second quantum well region, and the third quantum well region to have a respective well region thickness of at least about ten (10) nanometers.

44. The method of claim 43, further comprising forming each of the first quantum well region, the second quantum well region, and the third quantum well region to have a respective well region thickness of at least about twenty (20) nanometers.

45. The method of claim 33, further comprising forming the first barrier region to have a first bandgap energy, and forming the second barrier region to have a second bandgap energy less than the first bandgap energy.

46. The method of claim 33, further comprising forming the multi-quantum well structure to have a total structure thickness of at least about 10 nm.

47. The method of claim 33, further comprising forming the strained semiconductor material to comprise $In_zGa_{1-z}N$.

48. The method of claim 47, further comprising formulating the $In_zGa_{1-z}N$ such that z is between about 0.02 and about 0.17.

49. The method of claim 33, further comprising forming the strain relaxation layer to comprise at least one of a silicate glass, a phosphosilicate glass, a borosilicate glass, and a borophosphosilicate glass.

* * * * *